US012635346B2

(12) United States Patent
Tabatake

(10) Patent No.: US 12,635,346 B2
(45) Date of Patent: May 19, 2026

(54) OLED WITH A RIB AND A PARTITION BETWEEN SUBPIXELS

(71) Applicant: Magnolia White Corporation, Tokyo (JP)

(72) Inventor: Hiroshi Tabatake, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 741 days.

(21) Appl. No.: 18/090,530

(22) Filed: Dec. 29, 2022

(65) Prior Publication Data

US 2023/0217730 A1 Jul. 6, 2023

(30) Foreign Application Priority Data

Jan. 6, 2022 (JP) ................................. 2022-001086

(51) Int. Cl.
*H10K 59/122* (2023.01)
*H10K 50/813* (2023.01)

(52) U.S. Cl.
CPC ......... *H10K 59/122* (2023.02); *H10K 50/813* (2023.02)

(58) Field of Classification Search
CPC ........................... H10K 59/122; H10K 50/813
See application file for complete search history.

(56) References Cited

U.S. PATENT DOCUMENTS 11,348,983 B1 * 5/2022 Choung ........... H10K 59/80522
2004/0160170 A1 8/2004 Sato et al.

2009/0009069 A1 1/2009 Takata
2013/0001620 A1* 1/2013 Sugisawa ............. H10K 59/131
257/E33.062
2015/0187852 A1 7/2015 Isa
2016/0190508 A1* 6/2016 Nakamura ........... H10K 50/844
257/40
2019/0363275 A1 11/2019 Ochi et al.
2021/0184157 A1 6/2021 Tan
2022/0077257 A1* 3/2022 Choung ............... H10K 59/173
(Continued)

FOREIGN PATENT DOCUMENTS

JP 2000-195677 A 7/2000
JP 2004-207217 A 7/2004
(Continued)

OTHER PUBLICATIONS

Taiwanese Office Action issued Jul. 21, 2025, in TW Application No. 113105806, 2pp.
(Continued)

*Primary Examiner* — Peter Bradford
(74) *Attorney, Agent, or Firm* — XSENSUS LLP

(57) ABSTRACT

According to one embodiment, a display device includes a substrate, an insulating layer, a lower electrode, a rib including an aperture and covering a periphery of the lower electrode, a partition above the rib, an upper electrode being in contact with the partition, and an organic layer between the electrodes. The organic layer includes a first organic layer that is in contact with the lower electrode through the aperture, and a second organic layer on the partition. At least a part of the periphery of the lower electrode is located between the insulating layer and the partition in a thickness direction of the insulating layer.

20 Claims, 7 Drawing Sheets

(56)        References Cited

U.S. PATENT DOCUMENTS

2022/0199937 A1*  6/2022  Nitta ..................... H10K 59/122
2022/0271115 A1*  8/2022  Harada ................ H10K 59/122
2023/0180506 A1*  6/2023  Lee ...................... H10K 50/822
                                                          257/40
2023/0209956 A1    6/2023  Tabatake

FOREIGN PATENT DOCUMENTS

JP          2008-135325  A      6/2008
JP           2009-32673  A      2/2009
JP          2010-118191  A      5/2010
JP          2023095158  A      7/2023
WO          2018/179308  A1    10/2018

OTHER PUBLICATIONS

Japanese Office Action issued Aug. 5, 2025, in JP Application No. 2022-001086, 12 pp.
Indian Office Action issued Mar. 28, 2024, in corresponding Indian Patent Application No. 202314000404, 5pp.
Office Action issued Oct. 29, 2024, in corresponding Taiwanese Patent Application No. 113105806, 7pp.

* cited by examiner

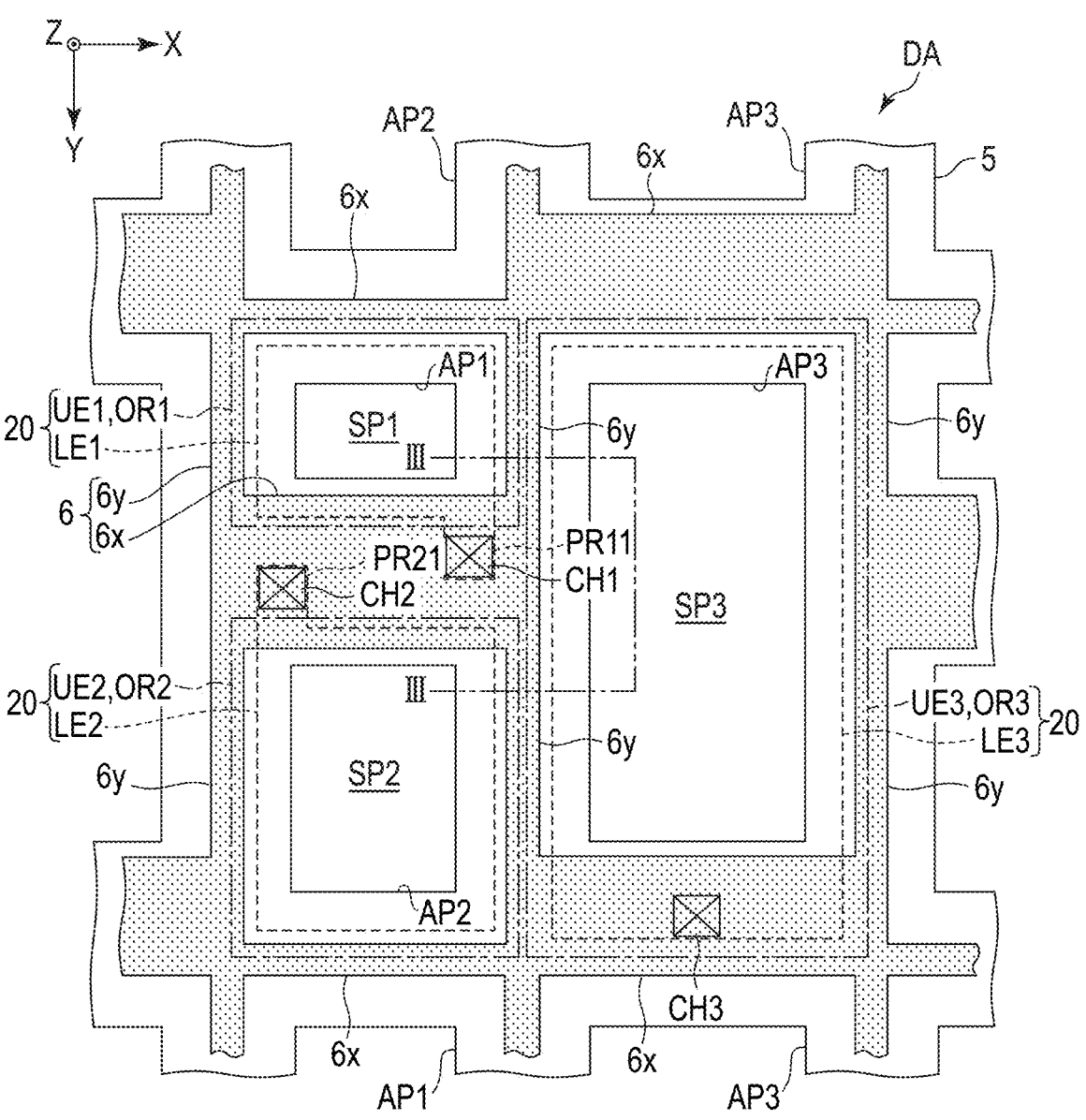
F I G. 2

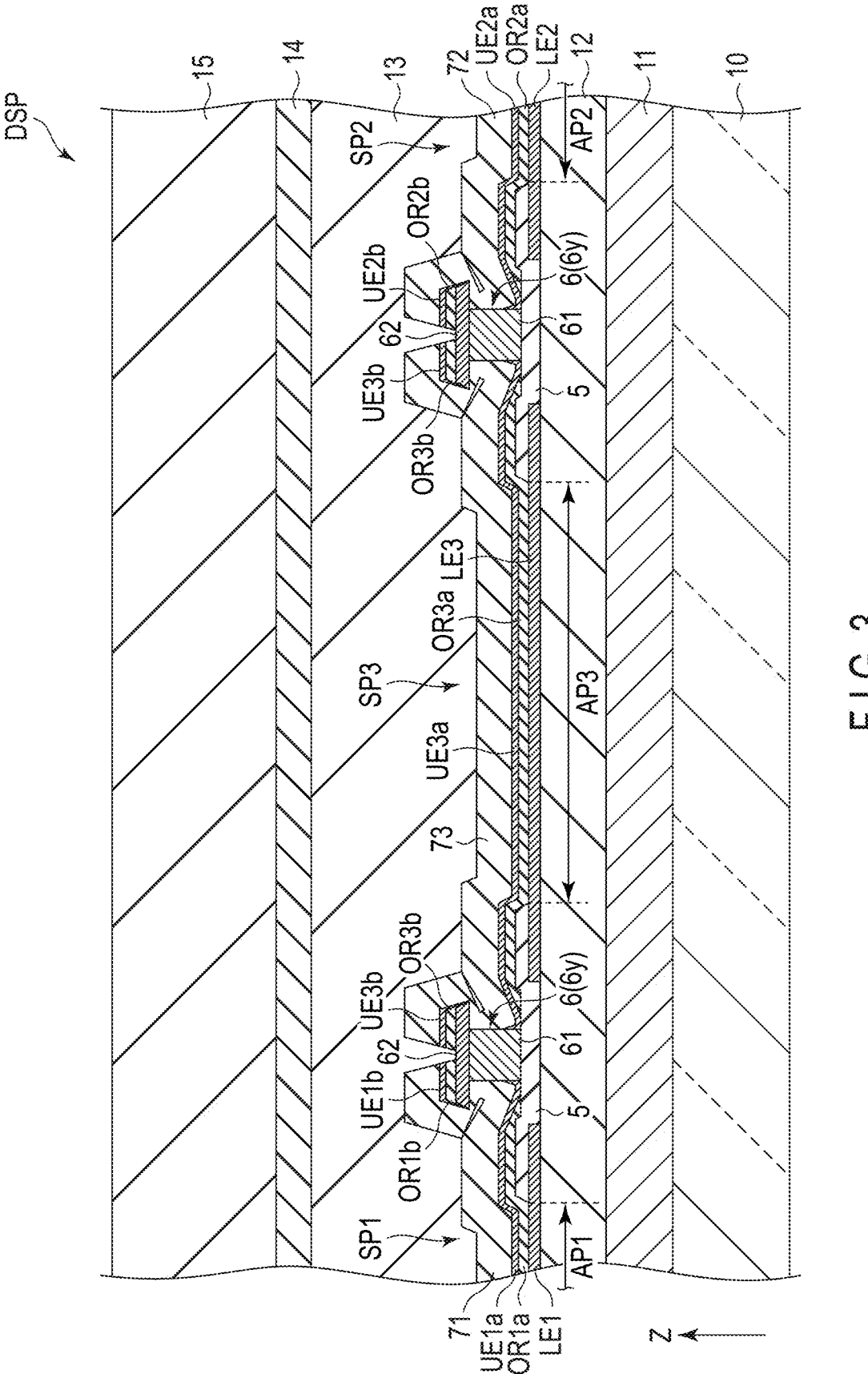
F I G. 3

OLED WITH A RIB AND A PARTITION BETWEEN SUBPIXELS

CROSS-REFERENCE TO RELATED APPLICATIONS

This application is based upon and claims the benefit of priority from Japanese Patent Application No. 2022-001086, filed Jan. 6, 2022, the entire contents of which are incorporated herein by reference.

FIELD

Embodiments described herein relate generally to a display device.

BACKGROUND

Recently, display devices with organic light-emitting diodes (OLEDs) applied thereto as display elements have been put into practical use. This display device comprises a lower electrode, an organic layer covering the lower electrode, and an upper electrode covering the organic layer. Ribs may be arranged to cover the periphery of the lower electrode and, in this case, the organic layer and a part of the upper electrode are formed on the ribs.

Generally, the organic layer and the upper electrode are formed thinly by vapor deposition. For this reason, if a surface where the organic layer or the upper electrode is formed has a steep step, the organic layer or the upper electrode may break off due to this step, resulting in display failure.

BRIEF DESCRIPTION OF THE DRAWINGS

FIG. 2 is a view showing an example of a layout of sub-pixels according to the first embodiment.

FIG. 3 is a schematic cross-sectional view showing the display device taken along line III-III in FIG. 2.

DETAILED DESCRIPTION

Figure 1:
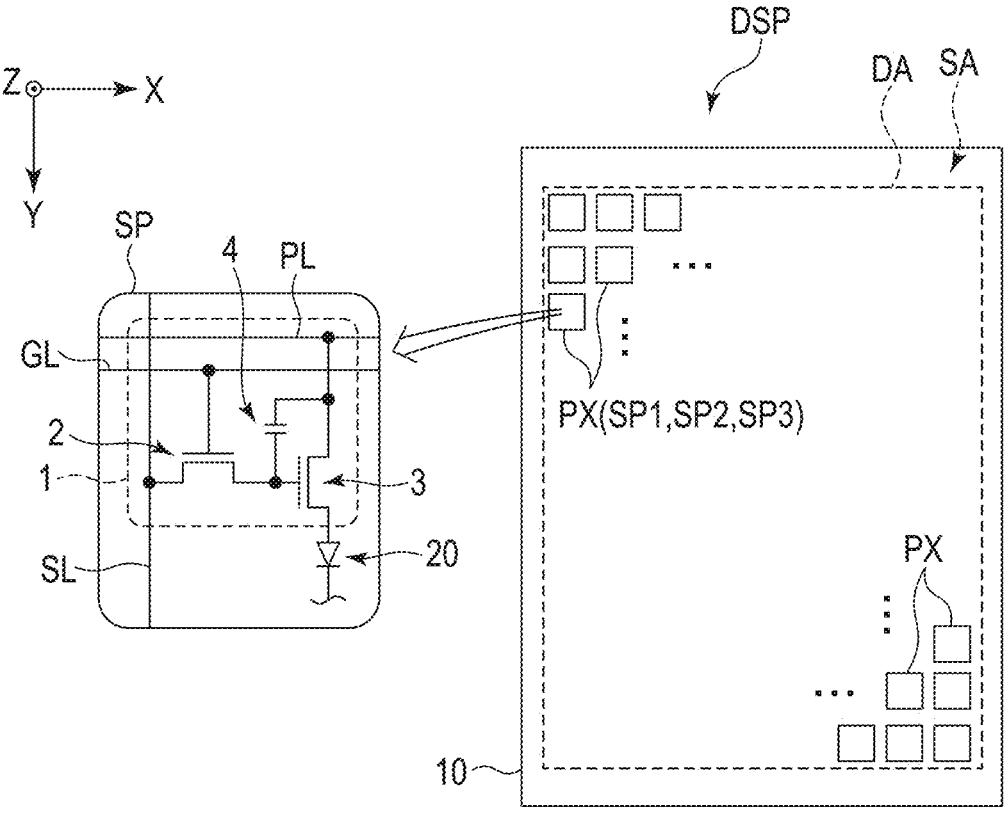
FIG. 1 is a view showing a configuration example of a display device according to a first embodiment.

In general, according to one embodiment, a display device includes a substrate; an insulating layer arranged above the substrate; a lower electrode arranged above the insulating layer; a rib formed of an inorganic material, including an aperture which overlaps with the lower electrode, and covering a periphery of the lower electrode; a partition arranged above the rib; an upper electrode opposed to the lower electrode and being in contact with the partition; and an organic layer located between the lower electrode and the upper electrode to emit light in accordance with a potential difference between the lower electrode and the upper electrode. The organic layer includes a first organic layer that is in contact with the lower electrode through the aperture, and a second organic layer located on the partition and separated from the first organic layer. At least a part of the periphery of the lower electrode is located between the insulating layer and the partition in a thickness direction of the insulating layer.

According to this configuration, a display device capable of allowing the display quality to be improved can be provided.

Several embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. In addition, in the specification and drawings, structural elements which function in the same or a similar manner to those described in connection with preceding drawings are denoted by like reference numbers, detailed description thereof being omitted unless necessary.

In the drawings, an X-axis, a Y-axis and a Z-axis orthogonal to each other are described to facilitate understanding as needed. A direction along the X-axis is referred to as a first direction X, a direction along the Y-axis is referred to as a second direction Y, and a direction along the Z-axis is referred to as a third direction Z. Viewing various elements parallel to the third direction Z is referred to as planar view.

The display device of each of the embodiments is an organic electroluminescent display device comprising an organic light emitting diode (OLED) as a display element, and can be mounted on televisions, personal computers, vehicle-mounted devices, tablet terminals, smartphones, cell phone terminals, and the like.

First Embodiment

FIG. 1 is a plan view showing a configuration example of a display device DSP according to the embodiment. The display device DSP has a display area DA where images are displayed and a surrounding area SA around the display area DA, on an insulating substrate 10. The substrate 10 may be glass or a flexible resin film.

In the embodiment, the shape of the substrate 10 in planar view is a rectangular shape. However, the shape of the substrate 10 in planar view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. In one example, the pixel PX includes a red sub-pixel SP1 (first sub-pixel), a green sub-pixel SP2 (second sub-pixel) and a blue sub-pixel SP3 (third sub-pixel). The pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to the display element 20.

The configuration of the pixel circuit 1 is not limited to the example shown in the figure. For example, the pixel circuit 1 may comprise more thin-film transistors and capacitors.

The display element 20 is an organic light emitting diode (OLED) serving as a light emitting element. For example, the sub-pixel SP1 comprises a display element 20 that emits light of a red wavelength range, the sub-pixels SP2 comprises a display element 20 that emits light of a green wavelength range, and the sub-pixels SP3 comprises a display element 20 that emits light of a blue wavelength range.

FIG. 2 is a view showing an example of a layout of the sub-pixels SP1, SP2, and SP3. In the example of FIG. 2, the sub-pixels SP1 and SP2 are arranged in the second direction Y. Furthermore, each of the sub-pixels SP1 and SP2 is arranged with the sub-pixels SP3 in the first direction X.

When the sub-pixels SP1, SP2, and SP3 are arranged in such a layout, a row in which the sub-pixels SP1 and SP2 are alternately arranged in the second direction Y and a row in which a plurality of sub-pixels SP3 are repeatedly arranged in the second direction Y are formed in the display area DA. These rows are alternately arranged in the first direction X.

The layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes apertures AP1, AP2, and AP3 in the sub-pixels SP1, SP2, and SP3, respectively. In the example shown in FIG. 2, the aperture AP2 is larger than the aperture AP1, and the aperture AP3 is larger than the aperture AP2.

The partition 6 overlaps with the rib 5 in planar view. The partition 6 includes a plurality of first partitions 6x extending in the first direction X and a plurality of second partitions 6y extending in the second direction Y. The plurality of first partitions 6x are located between the apertures AP1 and AP2 adjacent in the second direction Y and between two apertures AP3 adjacent in the second direction Y. The second partitions 6y are located between the apertures AP1 and AP3 adjacent in the first direction X and between the apertures AP2 and AP3 adjacent in the first direction X.

In the example in FIG. 2, the first partitions 6x and the second partitions 6y are connected to each other. Thus, the partition 6 has a grating pattern surrounding the apertures AP1, AP2, and AP3 as a whole. The partition 6 is considered to include apertures at the sub-pixels SP1, SP2, and SP3, similarly to the rib 5.

The sub-pixel SP1 comprises a lower electrode LE1, an upper electrode UE1, and an organic layer OR1 each overlapping with the aperture AP1. The sub-pixel SP2 comprises a lower electrode LE2, an upper electrode UE2, and an organic layer OR2 each overlapping with the aperture AP2. The sub-pixel SP3 comprises a lower electrode LE3, an upper electrode UE3, and an organic layer OR3 each overlapping with the aperture AP3. In the example shown in FIG. 2, outer shapes of the upper electrode UE1 and the organic layer OR1 correspond to each other, outer shapes of the upper electrode UE2 and the organic layer OR2 correspond to each other, and outer shapes of the upper electrode UE3 and the organic layer OR3 correspond to each other.

The lower electrode LE1, the upper electrode UE1, and the organic layer OR1 constitute the display element 20 of the sub-pixel SP1. The lower electrode LE2, the upper electrode UE2, and the organic layer OR2 constitute the display element 20 of the sub-pixel SP2. The lower electrode LE3, the upper electrode UE3, and the organic layer OR3 constitute the display element 20 of the sub-pixel SP3.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through the contact hole CH3.

The contact holes CH1 and CH2 entirely overlap with the first partition 6x between the apertures AP1 and AP2 adjacent in the second direction Y. The contact hole CH3 entirely overlaps with the first partition 6x between two apertures AP3 adjacent in the second direction Y.

In the example in FIG. 2, the lower electrodes LE1 and LE2 include protrusions PR11 and PR21 (first protrusions), respectively. The protrusion PR11 protrudes from a main body of the lower electrode LE1 (portion overlapping with the aperture AP1) toward the contact hole CH1. The protrusion PR21 protrudes from a main body of the lower electrode LE2 (portion overlapping with the aperture AP2) toward the contact hole CH2. The contact holes CH1 and CH2 overlap with the protrusions PR11 and PR21, respectively.

FIG. 3 is a schematic cross-sectional view showing the display device DSP taken along line III-III in FIG. 2. A circuit layer 11 is arranged on the substrate 10 described above. The circuit layer 11 includes various circuits and lines such as the pixel circuits 1, the scanning lines GL, the signal lines SL and the power lines PL shown in FIG. 1. The circuit layer 11 is covered with an insulating layer 12. The insulating layer 12 functions as a planarization film for planarizing uneven parts generated by the circuit layer 11. Although not shown in the cross section of FIG. 3, the contact holes CH1, CH2, and CH3 are provided in the insulating layer 12.

The lower electrodes LE1, LE2, and LE3 are arranged on the insulating layer 12. The rib 5 is arranged on the insulating layer 12 and the lower electrodes LE1, LE2, and LE3. End parts of the lower electrodes LE1, LE2, and LE3 are covered with the rib 5.

The partition 6 includes a lower portion 61 arranged on the rib 5 and an upper portion 62 that covers an upper surface of the lower portion 61. The upper portion 62 has a width greater than the lower portion 61. As a result, both the end parts of the upper 62 protrude beyond the side surfaces of the lower portion 61 in FIG. 3. This shape of the partition 6 is referred to as overhanging.

The organic layer OR1 shown in FIG. 2 includes a first organic layer OR1a and a second organic layer OR1b that are separated from each other. In addition, the upper electrode UE1 shown in FIG. 2 includes a first upper electrode UE1a and a second upper electrode UE1b that are separated from each other. As shown in FIG. 3, the first organic layer OR1a is in contact with the lower electrode LE1 through the aperture AP1 and covers a part of rib 5. The second organic layer OR1b is located on the upper portion 62. The first upper electrode UE1a is opposed to the lower electrode LE1 and covers the first organic layer OR1a. Furthermore, the first upper electrode UE1a is in contact with the side surface of the lower portion 61. The second upper electrode UE1*b* is located on the partition 6 and covers the second organic layer OR1*b*.

The organic layer OR2 shown in FIG. 2 includes a first organic layer OR2*a* and a second organic layer OR2*b* that are separated from each other. In addition, the upper electrode UE2 shown in FIG. 2 includes a first upper electrode UE2*a* and a second upper electrode UE2*b* that are separated from each other. As shown in FIG. 3, the first organic layer OR2*a* is in contact with the lower electrode LE2 through the aperture AP2 and covers a part of the rib 5. The second organic layer OR2*b* is located on the upper portion 62. The first upper electrode UE2*a* is opposed to the lower electrode LE2 and covers the first organic layer OR2*a*. Furthermore, the first upper electrode UE2*a* is in contact with the side surface of the lower portion 61. The second upper electrode UE2*b* is located above the partition 6 and covers the second organic layer OR2*b*.

The organic layer OR3 shown in FIG. 2 includes a first organic layer OR3*a* and the second organic layer OR3*b* that are separated from each other. In addition, the upper electrode UE3 shown in FIG. 2 includes a first upper electrode UE3*a* and a second upper electrode UE3*b* that are separated from each other. As shown in FIG. 3, the first organic layer OR3*a* is in contact with the lower electrode LE3 through the aperture AP3 and covers a part of the rib 5. The second organic layer OR3*b* is located on the upper portion 62. The first upper electrode UE3*a* is opposed to the lower electrode LE3 and covers the first organic layer OR3*a*. Furthermore, the first upper electrode UE3*a* is in contact with the side surface of the lower portion 61. The second upper electrode UE3*b* is located above the partition 6 and covers the second organic layer OR3*b*.

Sealing layers 71, 72, and 73 are arranged in the sub-pixels SP1, SP2, and SP3, respectively. The sealing layer 71 continuously covers the first upper electrode UE1*a*, the side surface of the lower portion 61, and the second upper electrode UE1*b*. The sealing layer 72 continuously covers the first upper electrode UE2*a*, the side surface of the lower portion 61, and the second upper electrode UE2*b*. The sealing layer 73 continuously covers the first upper electrode UE3*a*, the side surfaces of the lower portion 61, and the second upper electrode UE3*b*.

In the example in FIG. 3, the second organic layer OR1*b*, the second upper electrode UE1*b*, and the sealing layer 71 on the partition 6 between the sub-pixels SP1 and SP3 are separated from the second organic layer OR3*b*, the second upper electrode UE3*b*, and the sealing layer 73 on this partition 6. In addition, the second organic layer OR2*b*, the second upper electrode UE2*b*, and the sealing layer 72 on the partition 6 between the sub-pixels SP2 and SP3 are separated from the second organic layer OR3*b*, the second upper electrode UE3*b*, and the sealing layer 73 on this partition 6.

The sealing layers 71, 72, and 73 are covered with a resin layer 13. The resin layer 13 is covered with a sealing layer 14. Furthermore, the sealing layer 14 is covered with a resin layer 15.

The insulating layer 12 and the resin layers 13 and 15 are formed of an organic material. The rib 5 and the sealing layers 14, 71, 72, and 73 are formed of, for example, an inorganic material such as silicon nitride (SiNx).

The lower portion 61 of the partition 6 is conductive. The upper portion 62 of the partition 6 may also be conductive. The lower electrodes LE1, LE2, and LE3 may be formed of a transparent conductive material such as ITO and may have a multilayer structure of a metallic material such as silver (Ag) and a transparent conductive material. The upper electrodes UE1, UE2, and UE3 are formed of, for example, a metallic material such as an alloy (MgAg) of magnesium and silver. The upper electrodes UE1, UE2, and UE3 may be formed of a transparent conductive material such as ITO.

When potentials of the lower electrodes LE1, LE2, and LE3 are relatively higher than those of the upper electrodes UE1, UE2, and UE3, the lower electrodes LE1, LE2, and LE3 correspond to anodes, and the upper electrodes UE1, UE2, and UE3 correspond to cathodes. In addition, when the potentials of the upper electrodes UE1, UE2, and UE3 are relatively higher than those of the lower electrodes LE1, LE2, and LE3, the upper electrodes UE1, UE2, and UE3 correspond to anodes, and the lower electrodes LE1, LE2, and LE3 correspond to cathodes.

The organic layers OR1, OR2, and OR3 include a pair of functional layers and a light emitting layer interposed between these functional layers. As an example, each of the organic layers OR1, OR2, and OR3 includes a structure in which a hole-injection layer, a hole-transport layer, an electron blocking layer, an emitting layer, a hole blocking layer, an electron-transport layer, and an electron-injection layer are stacked in this order.

The sub-pixels SP1, SP2, and SP3 may further include cap layers for adjusting the optical characteristics of the light emitted from the emitting layers of the organic layers OR1, OR2, and OR3. Such a cap layer may be formed between the upper electrode UE1 and the sealing layer 71, between the upper electrode UE2 and the sealing layer 72, and between the upper electrode UE3 and the sealing layer 73.

A common voltage is supplied to the partition 6. This common voltage is supplied to each of the first upper electrodes UE1*a*, UE2*a*, and UE3*a* that are in contact with the side surfaces of the lower portion 61. A pixel voltage is supplied to the lower electrodes LE1, LE2, and LE3 through the pixel circuits 1 included in the respective sub-pixels SP1, SP2, and SP3.

When a potential difference is formed between the lower electrode LE1 and the upper electrode UE1, the emitting layer of the first organic layer OR1*a* emits light of the red wavelength range. When a potential difference is formed between the lower electrode LE2 and the upper electrode UE2, the emitting layer of the first organic layer OR2*a* emits light of the green wavelength range. When a potential difference is formed between the lower electrode LE3 and the upper electrode UE3, the emitting layer of the first organic layer OR3*a* emits light of the blue wavelength range.

As another example, the emitting layers of the organic layers OR1, OR2, and OR3 may emit light of the same color (for example, white). In this case, the display device DSP may comprise color filters that convert the light emitted from the emitting layers into light of the colors corresponding to the sub-pixels SP1, SP2, and SP3. In addition, the display device DSP may comprise color filters that are excited by the light emitted from the emitting layers and generate the light of the colors corresponding to the sub-pixels SP1, SP2, and SP3.

The thickness of the rib 5 formed of an inorganic material is sufficiently small as compared to the thickness of the partition 6 and the insulating layer 12. The thickness of each of the lower electrodes LE1, LE2, and LE3 and the organic layers OR1, OR2, and OR3 is smaller than the thickness of the rib 5. In addition, the thickness of each of the upper electrodes UE1, UE2, and UE3 is smaller than the thickness of the rib 5 and the thickness of the lower electrodes LE1, LE2, and LE3.

The thickness of the rib 5 is, for example, 200 nm or more and 400 nm or less. The thickness of the lower electrodes LE1, LE2, and LE3 is, for example, a half or less of the thickness of the ribs 5. The thickness of the upper electrodes UE1, UE2, and UE3 is, for example, a half or less or a quarter or less of the thickness of the lower electrodes LE1, LE2, and LE3.

Figure 4:
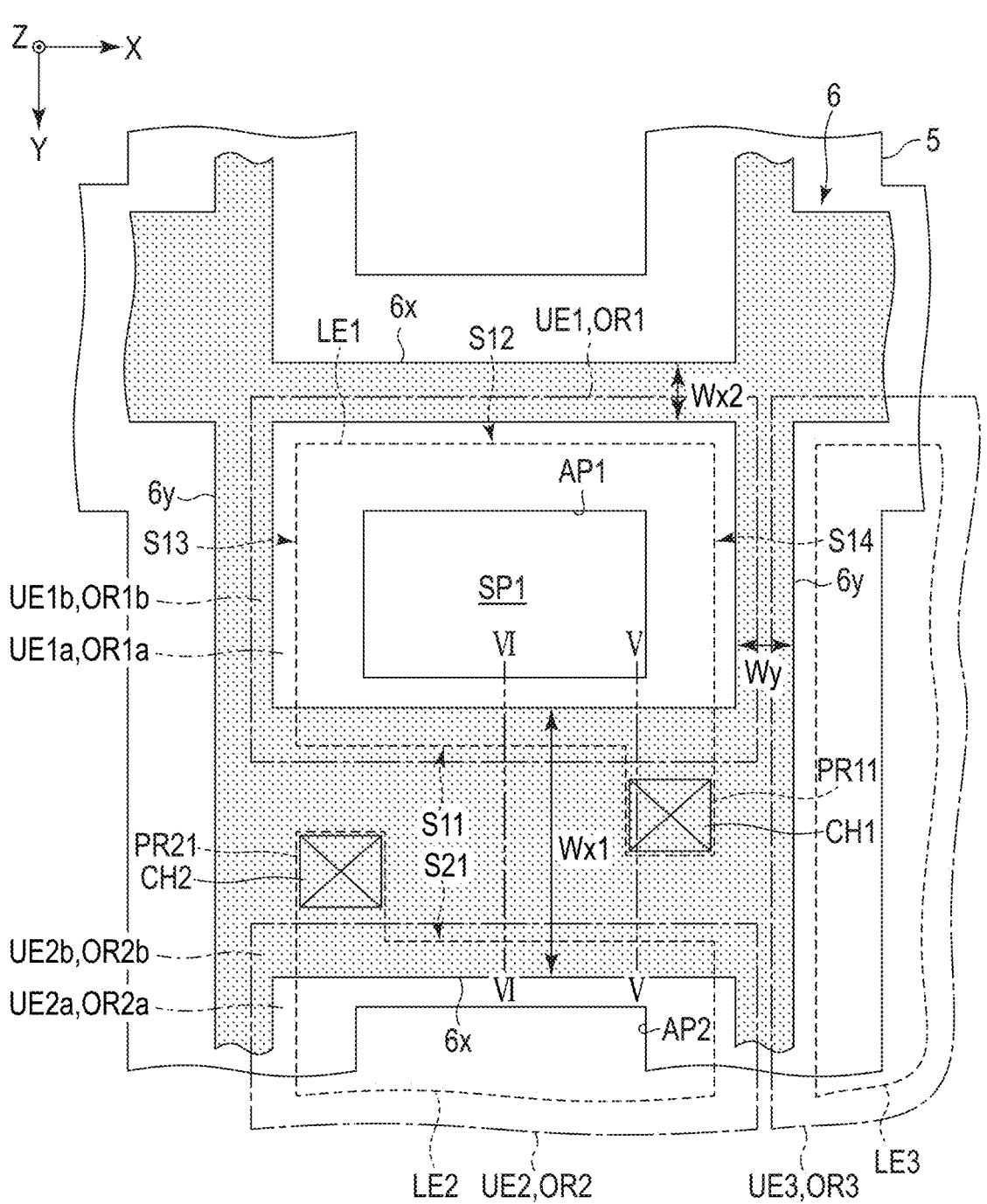
FIG. 4 is a schematic enlarged plan view showing a part of FIG. 2.

FIG. 4 is an enlarged schematic plan view showing the vicinity of the sub-pixel SP1 in FIG. 2. A part overlapping with the partition 6, of the area surrounded by a chain line showing outlines of the upper electrode UE1 and the organic layer OR1, corresponds to the second upper electrode UE1*b* and the second organic layer OR1*b* described above. Furthermore, a part located inside the second upper electrode UE1*b* and the second organic layer OR1*b*, of the area surrounded by the chain line, corresponds to the first upper electrode UE1*a* and the first organic layer OR1*a* described above.

The second upper electrode UE1*b* and the second organic layer OR1*b* surround the first upper electrode UE1*a*, the first organic layer OR1*a*, and the aperture AP1. Similarly, the second upper electrode UE2*b* and the second organic layer OR2*b* shown in FIG. 3 surround the first upper electrode UE2*a*, the first organic layer OR2*a*, and the aperture AP2. In addition, the second upper electrode UE3*b* and the second organic layer OR3*b* shown in FIG. 3 surround the first upper electrode UE3*a*, the first organic layer OR3*a*, and the aperture AP3.

In the embodiment, the entire contact hole CH1 overlaps with the first partition 6*x*. The contact hole CH1 is located between the organic layers OR1 and OR2 (or between the upper electrodes UE1 and UE2) in the second direction Y.

The first partition 6*x* overlapping with the contact hole CH1 has a width Wx1 in the second direction Y. The first partition 6*x* that does not overlap with the contact hole CH1 (first partition 6*x* on an upper side in the figure) has a width Wx2. Each of the second partitions 6*y* has a width Wy in the first direction X. In the example in FIG. 4, the width Wx1 is larger than the width Wx2 and the width Wy (Wx1>Wx2, Wy). As an example, the width Wy is equal to the width Wx2.

The periphery (outline) of the lower electrode LE1 has a first side S11, a second side S12, a third side S13, and a fourth side S14. The first side S11 extends in the first direction X. The second side S12 is located on a side opposite to the first side S11 in the second direction Y and extends in the first direction X. The third side S13 extends in the second direction Y. The fourth side S14 is located on a side opposite to the third side S13 in the first direction X and extends in the second direction Y.

The first side S11 is located between the contact holes CH1 and the aperture AP1 in the second direction Y and overlaps with the first partition 6*x* on a lower side of the figure. The protrusion PR11 protrudes from the first side S11 toward the lower electrode LE2 and overlaps with the contact hole CH1.

In the example of FIG. 4, the second side S12 is located between the aperture AP1 and the first partition 6*x* on the upper side of the figure, in the second direction Y. In other words, the second side S12 does not overlap with the partition 6. The third side S13 is located between the aperture AP1 and the second partition 6*y* on the left side of the figure, in the first direction X. The fourth side S14 is located between the aperture AP1 and the second partition 6*y* on the right side of the figure, in the first direction X. Parts of the third side S13 and the fourth side S14 overlap with the first partition 6*x*, but the remaining portions do not overlap with the partition 6.

The first partition 6*x* with which the contact hole CH1 overlaps also overlaps with the entire contact hole CH2. The contact hole CH2 is located between the organic layers OR1 and OR2 (or between the upper electrodes UE1 and UE2) in the second direction Y. The contact holes CH1 and CH2 are arranged in the first direction X. The lower electrode LE2 has a first side S21 that overlaps with this first partition 6*x*. Most of the other sides of the lower electrode LE2 do not overlap with the partition 6, similarly to the sides S12, S13, and S14 of the lower electrode LE1. The protrusion PR21 protrudes from the first side S21 toward the lower electrode LE1 and overlaps with the contact hole CH2. Although not shown in FIG. 4, as regards the lower electrode LE3, too, one side adjacent to the contact hole CH3 overlaps with the first partition 6*x*, and most of the other sides do not overlap with the partition 6.

Figure 5:
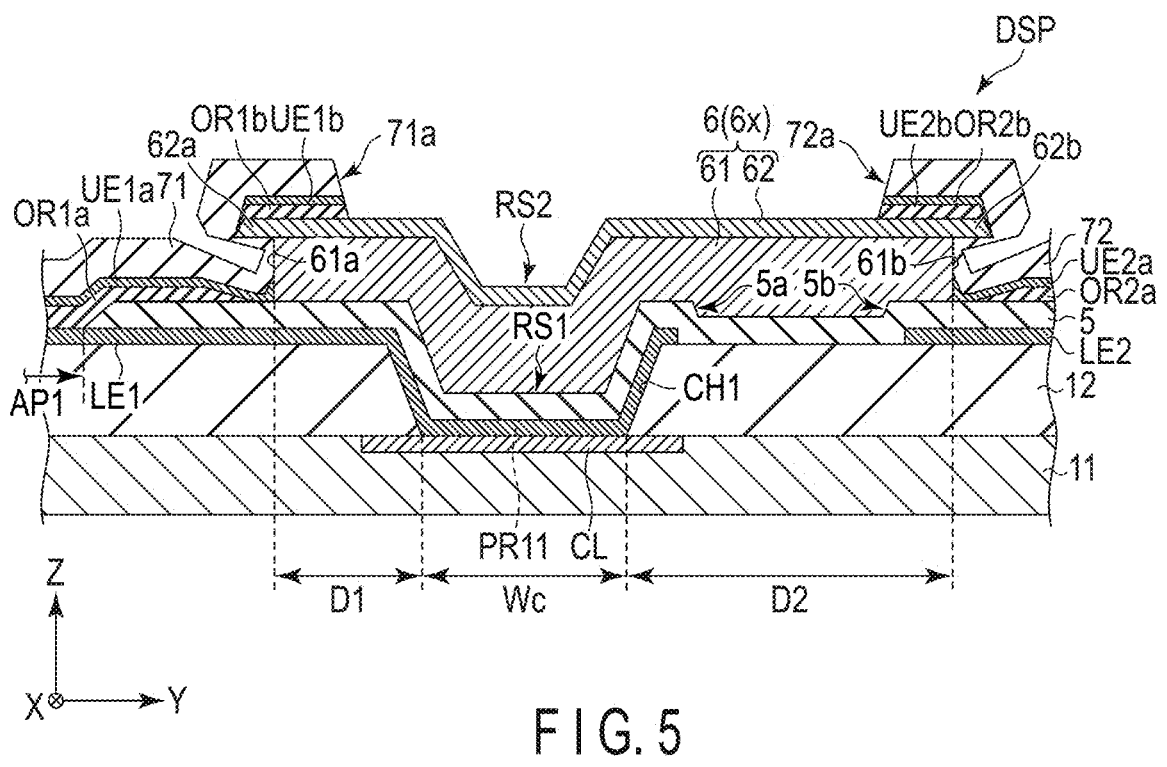
FIG. 5 is a schematic cross-sectional view showing the display device taken along line V-V in FIG. 4.

FIG. 5 is a schematic cross-sectional view showing the display device DSP taken along line V-V in FIG. 4. In this figure, the substrate 10, the resin layers 13 and 15, and the sealing layer 14 shown in FIG. 3 are omitted.

The contact hole CH1 penetrates the insulating layer 12. The protrusion PR11 of the lower electrode LE1 is in contact with a conductive layer CL included in the circuit layer 11 through the contact hole CH1. The conductive layer CL corresponds to, for example, a source electrode or a drain electrode of the drive transistor 3 shown in FIG. 1.

The lower portion 61 of the first partition 6*x* (partition 6) has side surfaces 61*a* and 61*b*. The first upper electrode UE1*a* is in contact with a part of the side surface 61*a*. The other part of the side surface 61*a* is covered with the sealing layer 71. Similarly, the first upper electrode UE2*a* is in contact with a part of the side surface 61*b*. The other part of the side surface 61*b* is covered with the sealing layer 72.

The upper portion 62 of the first partition 6*x* includes an end part 62*a* protruding from the side surface 61*a* and an end part 62*b* protruding from the side surface 61*b*. In the example in FIG. 5, the sealing layer 71 covers a lower surface of the end part 62*a*, and the sealing layer 72 covers a lower surface of the end part 62*b*.

The second organic layers OR1*b* and OR2*b* located on the first partition 6*x* are spaced apart in the second direction Y. Similarly, the second upper electrodes UE1*b* and UE2*b* located on the first partition 6*x* are spaced apart in the second direction Y. Furthermore, an end part 71*a* of the sealing layer 71 and an end part 72*a* of the sealing layer 72 are located on the first partition 6*x* and are spaced apart in the second direction Y.

In the embodiment, since the rib 5 is sufficiently thinner than the insulating layer 12, the rib 5 is depressed above the contact hole CH1 and a recess RS1 is formed. Furthermore, the first partition 6*x* arranged on the rib 5 is also depressed above the contact hole CH1, and a recess RS2 is formed.

The side surfaces 61*a* and 61*b* are located outside the recess RS1. In other words, the lower portion 61 covers an entire inner surface of the recess RS1 and also covers a flat upper surface of the rib 5 around the recess RS1.

The side surface 61*a* is located between the contact hole CH1 and the aperture AP1 in the second direction Y. The side surface 61*b* is located between the contact hole CH2 and the aperture AP2 (see FIG. 4) in the second direction Y.

A distance between the side surface 61*a* and the contact hole CH1 (opening in the lower surface of the insulating layer 12) is defined as D1, a distance between the side surface 61*b* and the contact hole CH1 (above-mentioned opening) is defined as D2, and a width of the contact hole CH1 (above-mentioned opening) in the second direction Y is defined as Wc.

The distance D1 is, for example, 2.0 μm or more and, desirably, 4.5 μm or more from the viewpoint of forming the organic layer OR1 and the upper electrode UE1 in a desirable shape. The width Wc is, for example, 3 μm or more and 5 μm or less. In the example in FIG. 5, the width Wc is larger than the distance D1, and the distance D2 is larger than the width Wc (D1<Wc<D2). The distance and the width are not limited to this but, for example, the distance D1 may be larger than the width Wc.

The cross-sectional structure in the vicinity of the contact holes CH2 and CH3 is the same as the cross-sectional structure in the vicinity of the contact hole CH1 shown in FIG. 5. In other words, a distance between the contact holes CH2 and CH3 and the side surfaces $61a$ and $61b$ of the first partition $6x$ overlapping the holes is, for example, 2.0 μm or more and, desirably, 4.5 μm or more.

Figure 6:
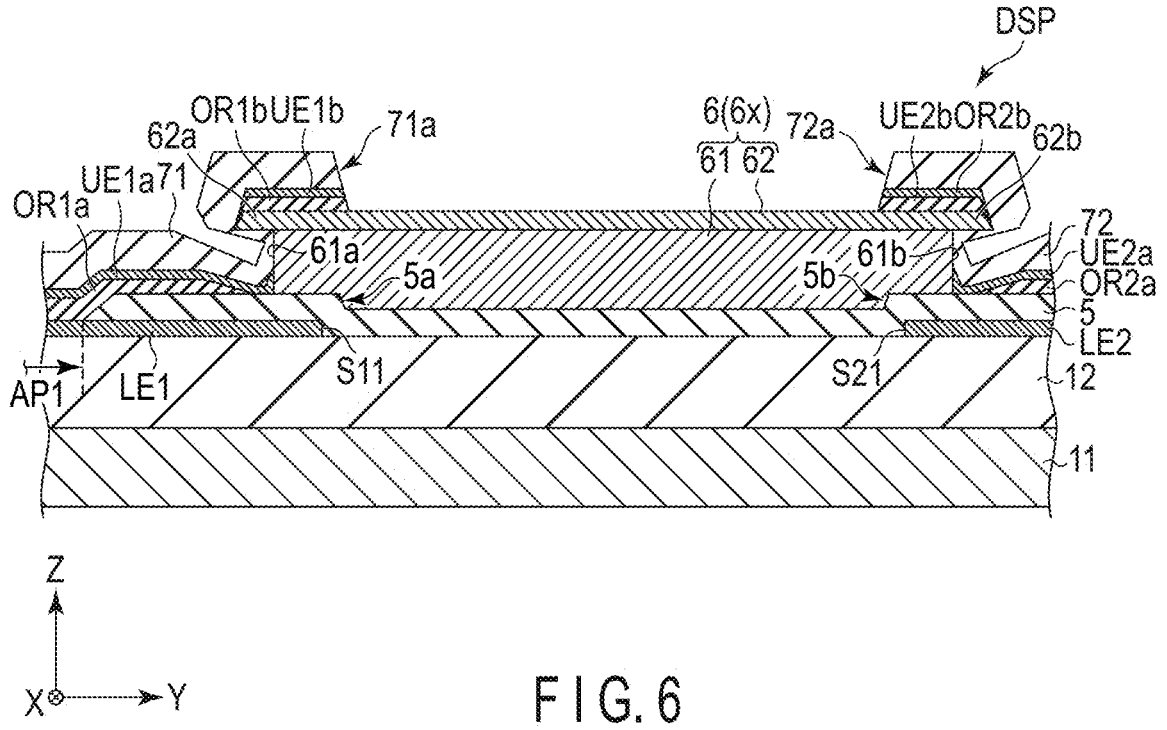
FIG. 6 is a schematic cross-sectional view showing the display device taken along line VI-VI in FIG. 4.

FIG. 6 is a schematic cross-sectional view showing the display device DSP taken along line VI-VI in FIG. 4. In this figure, like FIG. 5, the substrate 10, the resin layers 13 and 15, and the sealing layer 14 are omitted.

In the embodiment, since the rib 5 is thin, stepped portions caused by the lower electrodes LE1, LE2, and LE3 are formed on the upper surface of the rib 5. For example, in the example in FIG. 6, a stepped portion $5a$ is formed on the rib 5 in the vicinity of the first side S11 of the lower electrode LE1. In addition, a stepped portion $5b$ is formed on the rib 5 in the vicinity of the first side S21 of the lower electrode LE2. Similar stepped portions $5a$ and $5b$ are also formed in the cross section of FIG. 5.

In the embodiment, as shown in FIG. 4, the first side S11 and the protrusion PR11 entirely overlap with the first partition $6x$. In other words, as shown in FIG. 5 and FIG. 6, the first side S11 and the protrusion PR11 are located between the insulating layer 12 and the first partition $6x$ (lower portion 61) in the third direction Z (thickness direction of the rib 5 and the insulating layer 12). The stepped portion $5a$ generated by the first side S11 and the protrusion PR11 is thereby covered with the first partition $6x$.

Similarly, the first side S21 and the protrusion PR21 of the lower electrode LE2 are located between the insulating layer 12 and the first partition $6x$ (lower portion 61) in the third direction Z. The stepped portion $5b$ generated by the first side S21 and the protrusion PR21 is thereby covered with the first partition $6x$.

As shown in FIG. 2, in the sub-pixel SP3, too, the side in the vicinity of the contact hole CH3, of the periphery of the lower electrode LE3 overlaps with the first partition $6x$. The stepped portions of the rib 5 generated by the sides are thereby covered with the first partition $6x$.

When forming the organic layer OR1, the material which is to be a base thereof is first deposited over the entire display area DA. At this time, the material is divided into the first organic layer $OR1a$ and the second organic layer $OR1b$ by the partition 6. Next, the material that is to be a base of the upper electrode UE1 is deposited over the entire display area DA. At this time, the material is divided into the first upper electrode $UE1a$ and the second upper electrode $UE1b$ by the partition 6.

Since the organic layer OR1 and the upper electrode UE1 that are thus formed by vapor deposition are thin, they may be divided by the stepped portion $5a$ of the rib 5. For example, in the vicinity of the second side S12, the third side S13, and the fourth side S14 shown in FIG. 4, the first organic layer $OR1a$ and the first upper electrode $UE1a$ can be broken by the stepped portion $5a$ generated by the sides.

The breakage of the first organic layer $OR1a$ and the first upper electrode $UE1a$ may be a cause of display failure. In particular, when the breakage of the first upper electrode $UE1a$ occurs over a wide area, a voltage may not be sufficiently supplied from the partition 6 to the first upper electrode $UE1a$. If the first upper electrode $UE1a$ is completely separated from the partition 6, the sub-pixel SP1 cannot light up.

With respect to this point, in the embodiment, the stepped portion $5a$ generated by the first side S11 is covered with the first partition $6x$. The breakage of the first upper electrode $UE1a$ is thereby suppressed at least in the vicinity of the first side S11. As a result, a voltage can be desirably supplied from the partition 6 to the first upper electrode $UE1a$ and the display quality of the display device DSP can be improved.

The advantages of the embodiment have been described by focusing the stepped portion $5a$ generated by the lower electrode LE1, and the organic layer OR1 and the upper electrode UE1, but the same advantages can be obtained by the organic layers OR2 and OR3 and the upper electrodes UE2 and UE3 in the structure of the embodiment. In addition, the structure in which the stepped portion $5a$ generated by the first side S11 is covered with the first partition $6x$ may also be applied to the vicinities of the second side S12, the third side S13, and the fourth side S14. In other words, if at least one side of the stepped portion 5 generated by the lower electrode LE, of the first side, the second side, the third side, and the fourth side of the pixel, is covered with the partition 6, the breakage of the upper electrode UE in the vicinity of the side can be suppressed and a voltage can be desirably suppled from the partition 6 to the upper electrode UE.

Second and third embodiments of the display device DSP will be disclosed below. In these embodiments, differences from the first embodiment will be mainly focused, and descriptions of the same configuration as the first embodiment will be omitted.

Second Embodiment

Figure 7:
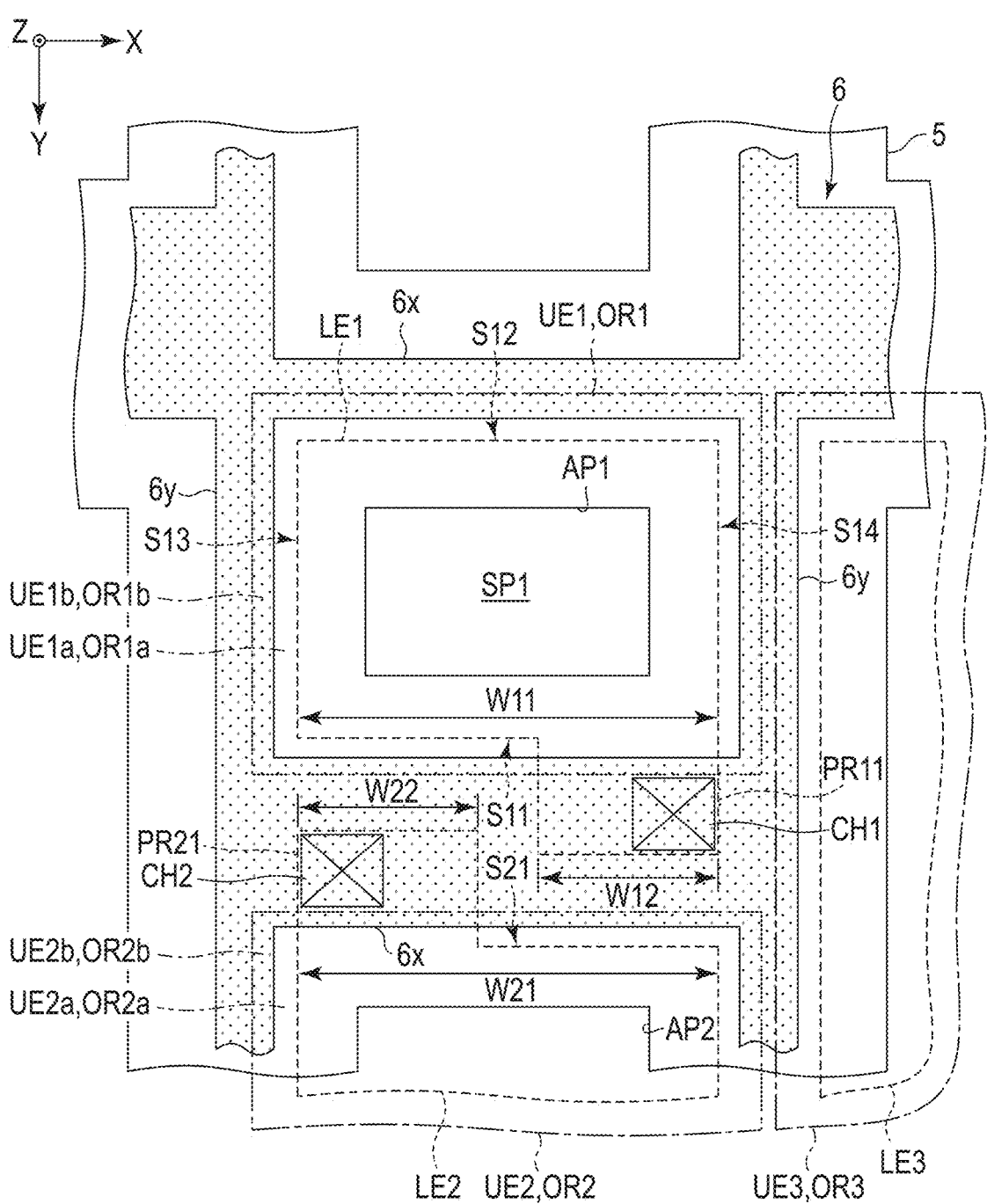
FIG. 7 is a schematic plan view showing a sub-pixel according to a second embodiment.

FIG. 7 is a schematic plan view showing a sub-pixel SP1 provided in a display device DSP according to a second embodiment, and a structure of its surrounding. In an example of this figure, a first side S11 of a lower electrode LE1 and a first side S21 of a lower electrode LE2 do not overlap with a partition 6. In contrast, protrusions PR11 and PR21 overlap with a first partition $6x$ and have a larger size than the example in FIG. 4.

A stepped portion of a rib 5 caused by the lower electrodes LE1 and LE2 is not generated on protrusions PR11 and PR21 except for peripheries of the protrusions PR11 and PR21. For this reason, an area where first upper electrodes $UE1a$ and $UE2a$ are made desirably conductive with the first partition $6x$ can be widely secured by enlarging the protrusions PR11 and PR21, and the same advantages as those of the first embodiment can be achieved.

As shown in FIG. 7, a width of the lower electrode LE1 in the first direction X is defined as W11, and a width of the protrusion PR11 in the first direction X is defined as W12. In addition, a width of the lower electrode LE2 in the first direction X is defined as W21, and a width of the protrusion PR21 in the first direction X is defined as W22.

The width W12 is desirably one third or more of the width W11. Similarly, the width W22 is desirably one third or more of the width W21. In one example, the widths W11 and W21 are equal to each other, and the widths W12 and W22 are equal to each other.

An interval needs to be formed between the protrusions PR11 and PR21 in order to suppress the conduction of the lower electrodes LE1 and LE2. For this reason, for example, the width W12 is less than a half of the width W11, and the width W22 is less than a half of the width W21.

Third Embodiment

Figure 8:
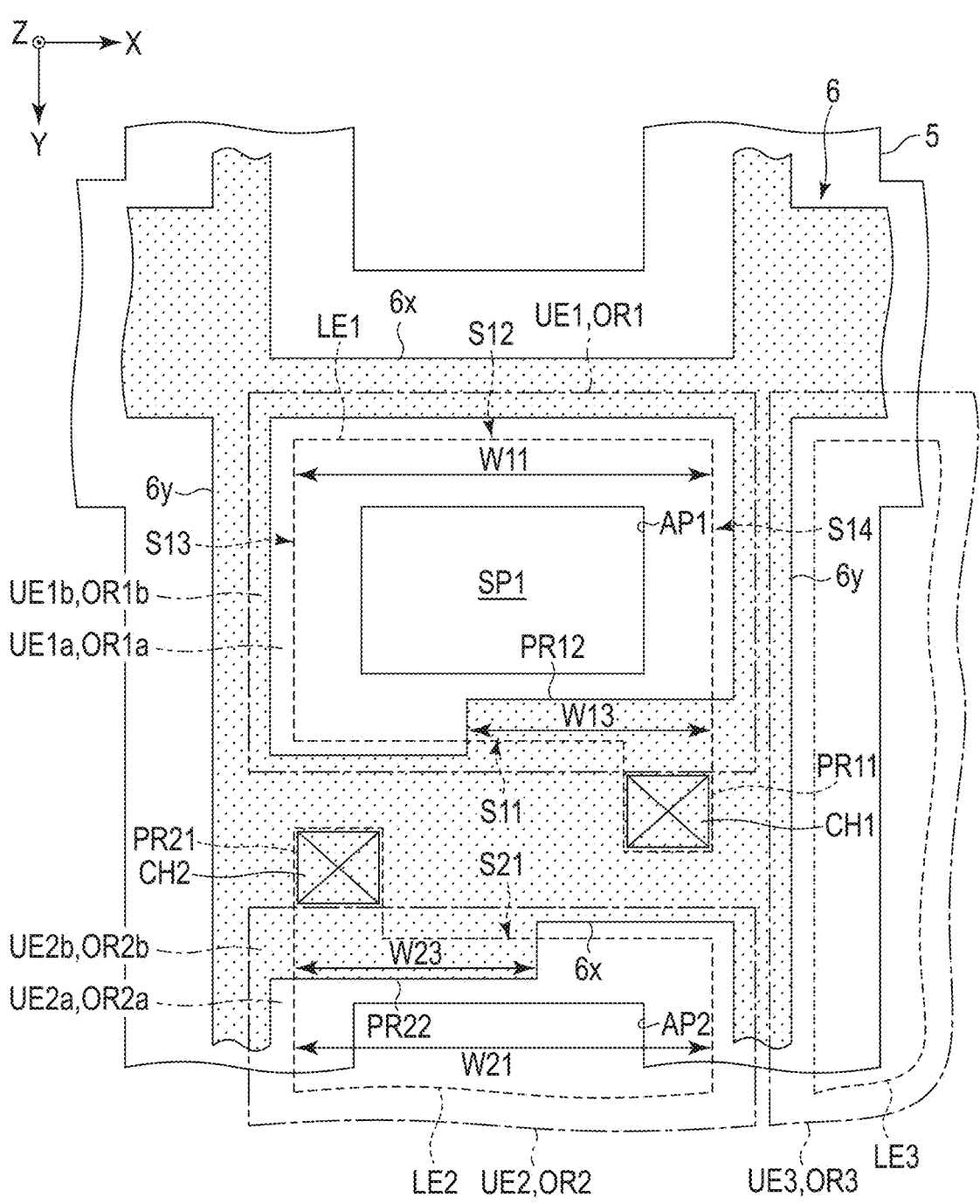
FIG. 8 is a schematic plan view showing a sub-pixel according to a third embodiment.

FIG. 8 is a schematic plan view showing a sub-pixel SP1 provided in a display device DSP according to a third embodiment, and a structure of its surrounding. In the example of this figure, first partitions 6x overlapping with contact holes CH1 and CH2 include protrusions PR12 and PR22 (second protrusions) that protrude toward apertures AP1 and AP2, respectively.

A part of a first side S11 of a lower electrode LE1 overlaps with the protrusion PR12, and a remaining part does not overlap with a first partition 6x. In addition, a part of the first side S21 of the lower electrode LE2 overlaps with a protrusion PR22, and a remaining part does not overlap with the first partition 6x. In other words, in the example of FIG. 8, a part of the first side S11 is located between an insulating layer 12 and the protrusion PR12 in the third direction Z, and a part of the first side S21 is located between the insulating layer 12 and the protrusion PR22 in the third direction Z. As another example, the entire first side S11 may be located between the insulating layer 12 and the protrusion PR12. In addition, the entire first side S21 may be located between the insulating layer 12 and the protrusion PR22.

Thus, an area where first upper electrodes UE1a and UE2a are made desirably conductive with the first partition 6x can also be secured by covering the peripheries of the lower electrodes LE1 and LE2 are covered with protrusions PR12 and PR22, and the same advantages as those of the first embodiment can be achieved.

As shown in FIG. 8, a width of the lower electrode LE1 in the first direction X is defined as W11, and a width of a portion of the lower electrode LE1 that overlaps with the protrusion PR12 (portion located between the insulating layer 12 and the protrusion PR12) is defined as W13. In addition, a width of the lower electrode LE2 in the first direction X is defined as W21, and a width of a portion of the lower electrode LE2 that overlaps with the protrusion PR22 (portion located between the insulating layer 12 and the protrusion PR22) is defined as W23.

The width W13 is desirably one third or more of the width W11. Similarly, the width W23 is desirably one third or more of the width W21. In one example, the widths W11 and W21 are equal to each other, and the widths W13 and W23 are equal to each other.

In the first to third embodiments, the configuration in which the first side S11 or the protrusion PR11, of the periphery of the lower electrode LE1, is located between the insulating layer 12 and the partition 6 has been exemplified. However, even if other portions of the periphery of the lower electrode LE1 are located between the insulating layer 12 and the partition 6, the same advantages as those of these embodiments can be obtained. In the lower electrodes LE2 and LE3, too, the portion arranged between the insulating layer 12 and the partition 6 can be selected as appropriate. In addition, the entire periphery of the lower electrodes LE1, LE2, and LE3 may be located between the insulating layer 12 and the partition 6.

All of display devices that can be implemented by a person of ordinary skill in the art through arbitrary design changes to the display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, the above embodiments with addition, deletion, and/or designed change of their structural elements by a person having ordinary skill in the art, or the above embodiments with addition, omission, and/or condition change of their processes by a person having ordinary skill in the art are encompassed by the scope of the present inventions without departing the spirit of the inventions.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:
   a substrate;
   an insulating layer arranged above the substrate;
   a lower electrode arranged above the insulating layer;
   a rib formed of an inorganic material, including an aperture which overlaps with the lower electrode, and covering a periphery of the lower electrode;
   a partition arranged above the rib;
   an upper electrode opposed to the lower electrode and being in contact with the partition; and
   an organic layer located between the lower electrode and the upper electrode to emit light in accordance with a potential difference between the lower electrode and the upper electrode,
   the organic layer including a first organic layer that is in contact with the lower electrode through the aperture, and a second organic layer located on the partition and separated from the first organic layer,
   at least a part of the periphery of the lower electrode being located between the insulating layer and the partition in a thickness direction of the insulating layer,
   the partition including a lower portion arranged on the rib, and an upper portion which is arranged on the lower portion and which includes an end part protruding from a side surface of the lower portion, and
   the second organic layer being arranged on the upper portion.

2. The display device of claim 1, further comprising:
   a pixel circuit arranged between the substrate and the insulating layer, wherein
   the insulating layer includes a contact hole which overlaps with the partition in planar view, and
   the lower electrode is connected to the pixel circuit through the contact hole.

3. The display device of claim 2, wherein
   the periphery of the lower electrode has a first side extending in a first direction, and
   the first side is located between the aperture and the contact hole in a second direction intersecting the first direction.

4. The display device of claim 3, wherein at least a part of the first side is located between the insulating layer and the partition in the thickness direction.

5. The display device of claim 3, wherein the lower electrode includes a first protrusion that protrudes toward the contact hole in planar view, and at least a part of the first protrusion is located between the insulating layer and the partition in the thickness direction.

6. The display device of claim 5, wherein a width of the first protrusion in the first direction is one third or more of a width of the lower electrode in the first direction.

7. The display device of claim 3, wherein the partition includes a second protrusion that protrudes toward the aperture in planar view, and at least a part of the first side is located between the insulating layer and the second protrusion in the thickness direction.

8. The display device of claim 7, wherein a width in the first direction of a portion of the lower electrode, which is located between the insulating layer and the second protrusion, is one third or more of a width of the lower electrode in the first direction.

9. The display device of claim 3, wherein the lower electrode has a second side located on a side opposite to the first side in the second direction, and the second side is located between the aperture and the partition in the second direction.

10. The display device of claim 1, wherein at least a part of the periphery of the lower electrode is located between the insulating layer and the lower portion in the thickness direction.

11. The display device of claim 1, wherein the upper electrode includes a first upper electrode covering the first organic layer, and a second upper electrode that covers the second organic layer and that is separated from the first upper electrode, and the first upper electrode is in contact with the side surface.

12. The display device of claim 11, wherein the lower portion is conductive.

13. The display device of claim 11, further comprising:

a sealing layer formed of an inorganic material to cover the first upper electrode, the side surface, and the second upper electrode.

14. The display device of claim 1, wherein the partition surrounds the aperture in planar view.

15. The display device of claim 1, wherein the second organic layer surrounds the aperture in planar view.

16. The display device of claim 1, wherein a thickness of the rib is smaller than a thickness of the partition.

17. The display device of claim 1, comprising:

a first sub-pixel, a second sub-pixel, and a third sub-pixel each including the lower electrode, the upper electrode, the organic layer, and the aperture, wherein the first sub-pixel and the third sub-pixel are arranged in a first direction, the first sub-pixel and the second sub-pixel are arranged in a second direction intersecting the first direction, and the partition includes a first partition arranged between the aperture of the first sub-pixel and the aperture of the second sub-pixel, and a second partition arranged between the aperture of the first sub-pixel and the aperture of the third sub-pixel.

18. The display device of claim 17, wherein a width of the first partition in the second direction is larger than a width of the second partition in the first direction.

19. The display device of claim 17, wherein at least a part of a periphery of the lower electrode of the first sub-pixel, and at least a part of a periphery of the lower electrode of the second sub-pixel are located between the insulating layer and the first partition in the thickness direction.

20. A display device comprising:

a substrate;

an insulating layer arranged above the substrate;

a pixel circuit arranged between the substrate and the insulating layer;

a lower electrode arranged above the insulating layer;

a rib formed of an inorganic material, including an aperture which overlaps with the lower electrode, and covering a periphery of the lower electrode;

a partition arranged above the rib;

an upper electrode opposed to the lower electrode and being in contact with the partition; and an organic layer located between the lower electrode and the upper electrode to emit light in accordance with a potential difference between the lower electrode and the upper electrode, the organic layer including a first organic layer that is in contact with the lower electrode through the aperture, and a second organic layer located on the partition and separated from the first organic layer, at least a part of the periphery of the lower electrode being located between the insulating layer and the partition in a thickness direction of the insulating layer, the insulating layer including a contact hole which overlaps with the partition in planar view, the lower electrode being connected to the pixel circuit through the contact hole, the periphery of the lower electrode having a first side extending in a first direction, the first side being located between the aperture and the contact hole in a second direction intersecting the first direction, the lower electrode including a first protrusion that protrudes toward the contact hole in planar view, and at least a part of the first protrusion being located between the insulating layer and the partition in the thickness direction.

\* \* \* \* \*